United States Patent [19]
Croset

[11] 3,983,284

[45] Sept. 28, 1976

[54] FLAT CONNECTION FOR A SEMICONDUCTOR MULTILAYER STRUCTURE

[75] Inventor: Michel Croset, Paris, France

[73] Assignee: Thomson-CSF, Paris, France

[22] Filed: Mar. 21, 1975

[21] Appl. No.: 560,591

Related U.S. Application Data

[63] Continuation of Ser. No. 365,519, May 31, 1973, abandoned.

[30] Foreign Application Priority Data

June 6, 1972 France .................. 72.19940

[52] U.S. Cl. .................. 428/195; 428/901; 427/90; 427/96; 156/17; 29/576 R; 148/33.3
[51] Int. Cl.² .................. B32B 3/00; C23B 1/08; H01L 27/10
[58] Field of Search .................. 427/96–99, 427/89, 90, 82; 428/195; 148/33.3; 29/576; 156/17

[56] References Cited
UNITED STATES PATENTS

| | | |
|---|---|---|
| 3,106,489 | 10/1963 | Lepselter .................. 427/89 |
| 3,231,421 | 1/1966 | Schmidt .................. 427/90 |
| 3,575,745 | 4/1971 | Hill .................. 427/96 X |
| 3,668,004 | 6/1972 | Yamamoto et al. .................. 428/195 X |
| 3,699,011 | 10/1972 | Nishimura .................. 427/96 X |
| 3,737,341 | 6/1973 | Croset et al. .................. 427/82 |
| 3,801,477 | 4/1974 | Ronen et al. .................. 427/90 X |
| 3,844,831 | 10/1974 | Cass et al. .................. 427/89 X |
| 3,862,017 | 1/1975 | Tsunemitsu et al. .................. 29/576 X |

*Primary Examiner*—Philip Dier
*Attorney, Agent, or Firm*—Cushman, Darby & Cushman

[57] ABSTRACT

Upon a substrate containing different zones which are to be connected with one another, there are successively deposited a layer of thickness $e_1$, of a first metal (tantalum) oxidizable by heat treatment, and a layer of thickness $e_2$ of a second metal (aluminium) non-oxidizable by said treatment, deposited upon the surface of the first layer in accordance with the desired connection profile. The thickness of the aluminium layer is controlled so that it is equal to the increase in thickness of the tantalum layer as a consequence of the transformation of the tantalum into tantalum oxide.

2 Claims, 9 Drawing Figures

FLAT CONNECTION FOR A SEMICONDUCTOR MULTILAYER STRUCTURE

This is a continuation of application Ser. No. 365,519 filed May 31, 1973, now abandoned.

The present invention relates to the connections utilised in the manufacture of semiconductor devices such for example as integrated circuits. It relates more particularly to the flat connections utilised in multilayer structures.

The qualities of planar structures are well known now and it is desirable that the flat character of these devices should be preserved after positioning of the connections. These latter, consequently, should not produce any increase in thickness or reduction for that matter.

On the other hand, in order to produce integrated circuit structures which are progressively more and more compact, it is necessary to produce crossed interconnections. The insulation of these latter is a difficult problem to resolve. One method consists in interposing between two conductive layers constituting two distinct connections, a layer of an insulating material. Unfortunately, at the present state of the art, the application of a conductive pattern layer results in a protuberance at the surface of the device and the deposition of a dielectric on said surface at a later time, results in a reduction in thickness opposite said protuberance.

The object of the present invention is to overcome these drawbacks and the invention relates to connections of a kind constituted by conductive layers embedded in layers of dielectric material in such a way that the external surfaces of both kinds of layers are always in one and the same plane.

The invention relates more particularly a flat connection for a semiconductor structure comprising at least one stage of the type constituted by at least one conductive layer embedded in at least one insulating layer wherein said conductive layer comprises at least one portion of a layer of a first metal which is readily transformable into a chemical compound by means of a predeterminate chemical treatment, a second layer of a second metal resistant to said chemical treatment partially masking said first conductive layer, said first metal being selected in a group which exhibits an increase in volume leading to an increase in thickness, at the time of transformation from metal to chemical compound, the initial thickness of said first layer, prior to transformation, being equal to $e_1$ and growing into $e_1$ plus said increase in thickness referenced $\Delta e_1$ after transformation, said second layer having a thickness $e_2$ equal to said increase in thickness $\Delta e_1$.

The invention will be better understood from a consideration of the following explanations and the attached Figures in which.

Figure 1:
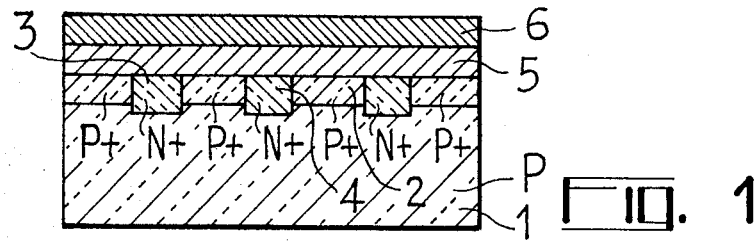
FIGS. 1 to 4 illustrate successive stages of manufacture of a first embodiment of a connection pattern in accordance with the invention, applied to a bipolar transistor.
Figure 2:
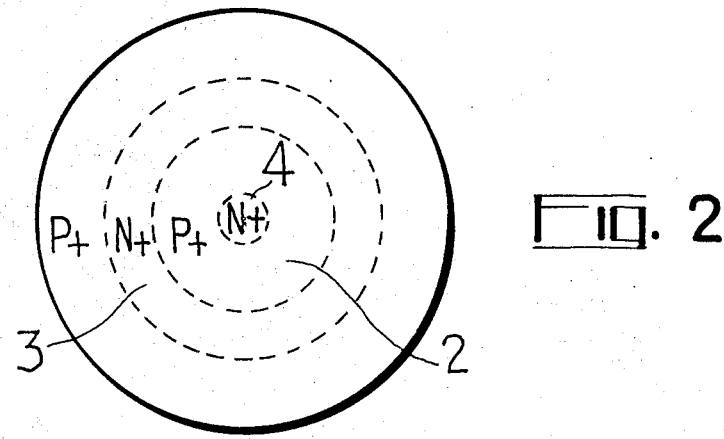

To illustrate a first example of the application of the invention, a device has been chosen which is shown in FIG. 1 in section and in FIG. 2 in plane; this is a bipolar transistor produced by the known method of masking and diffusion. Upon the substrate which is a wafer of P-type material, there have been respectively created the ring shaped base 2 which is of P+ type material, the circular emitter 3 which is of N+ type material and the collctor 4 which is likewise of N+ type material. A layer 5 of a metal $M_1$ is deposited over the whole surface of the wafer. The techniques of deposition utilised must satisfy certain requirements:

The process temperature should not exceed a value beyond which the electrical characteristics and metallurgical characteristics of the component might be impaired; the deposition must be carried out under the cleanest possible conditions in order to ensure that there is an intimate and non-contaminating contact between the deposited layer and the substrate. One of the various methods available, consists in utilising the techniques of atomising under vacuo. A layer 6 of a second metal $M_2$ is then deposited, which fully covers the first metal $M_1$ for example by the same method.

Figure 3:
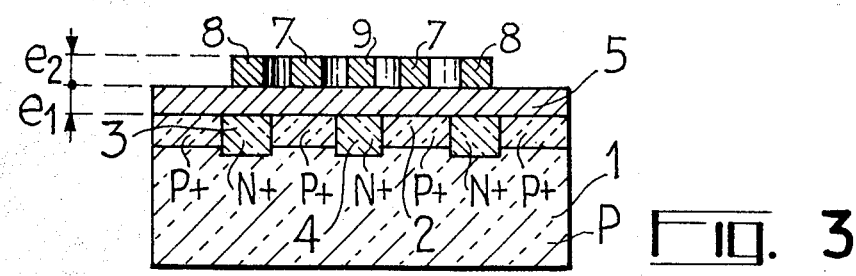

As FIG. 3 shows, the metal $M_2$ is subsequently eliminated by an appropriate known process for example by a selective etching everywhere except at the zones 2, 3 and 4 to which the connection is to be established, where it remains behind and follows the profile of the connections 7, 8 and 9.

The metals $M_1$ and $M_2$ are selected as follows.

The metal $M_1$ is for example a metal which can be readily oxidised by means of a given heat treatment, and the product of this oxidation is an oxide which has excellent dielectric qualities; the metal $M_2$ is chosen so that it is not affected by the process of oxidation of the metal $M_1$ vis-a-vis which it plays the part of a mask, protecting the masked regions of the metal $M_1$ against oxidation.

In accordance with the invention, the metal $M_1$ is chosen from the group of metals which, at the time of their transformation into chemical compounds, for example exhibit a large increase in volume such that the thickness of the layer 5, after oxidation, is equal to $(e_1 + \Delta e_1)$ if the initial thickness is $e_1$. In the case of oxidation, the metal is chosen for example from the group comprising tantalum, hafnium and zirconium.

On the other hand, in accordance with another feature of the invention, the thickness $e_2$ of the metal $M_e$ is made equal to $\Delta e_1$.

By way of a non-limitative example the metal $M_1$ can be taken to be tantalum and the metal $M_2$ aluminium.

If the initial volume of the tantalum layer is $V_M$, volume $V_{ox}$ of same layer after oxidation will be $$V_{ox} = 2{,}5\ V_M$$

The result is an increase in the initial thickness $e_1$ of the tantalum layer:

$$\Delta e_1 = 1{,}5\ e_1$$

In accordance with the invention, the thickness $e_2$ of the aluminium layer is made equal to $\Delta e_1$, that is to say $(1{,}5\ e_1)$.

Figure 4:
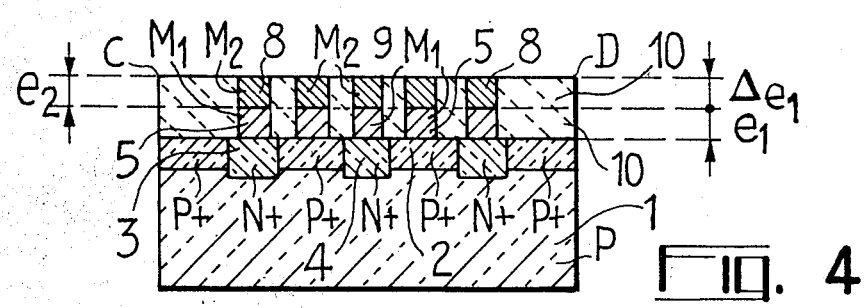

The wafer in then subjected to a heat treatment which produces oxidatin of the tantalum but does not affect either the aluminium layer, as FIG. 4 shows.

In view of the respective adjustment of the two thicknesses $e_1$ and $e_2$ of the oxidisable and non-oxidisable metals, the face CD of the wafer is perfectly flat.

In other words, it contains dielectric zones 10 having a thickness $(e_1 + \Delta e_1)$ and conductive zones which comprise on the one hand the unoxidised metal $M_2$ of thickness $e_2 + \Delta e_1$ and on the other hand the portions of the metal $M_1$ of thickness $e_1$, masked by the metal $M_2$. The sum of the thicknesses $(e_1 + e_2)$ of the metals $M_1 + M_2$ constituting the conductive zones, is thus equal to the thickness of the dielectric $(e_1 + \Delta e_1)$ since $e_2 = \Delta e_1$.

The manufacturing process of the connections in accordance with the invention thus gives rise to a device which has a flat surface facilitating its subsequent use in a large number of applications.

It is clear that this operation can be repeated several times, thus producing multilayer structures in which each of the steps or levels remains perfectly flat.

This property is evidenced by means of a second example of the application of the invention. This example pertains, for example, to the production of crossed interconnections in multilayer circuits.

Figure 5:
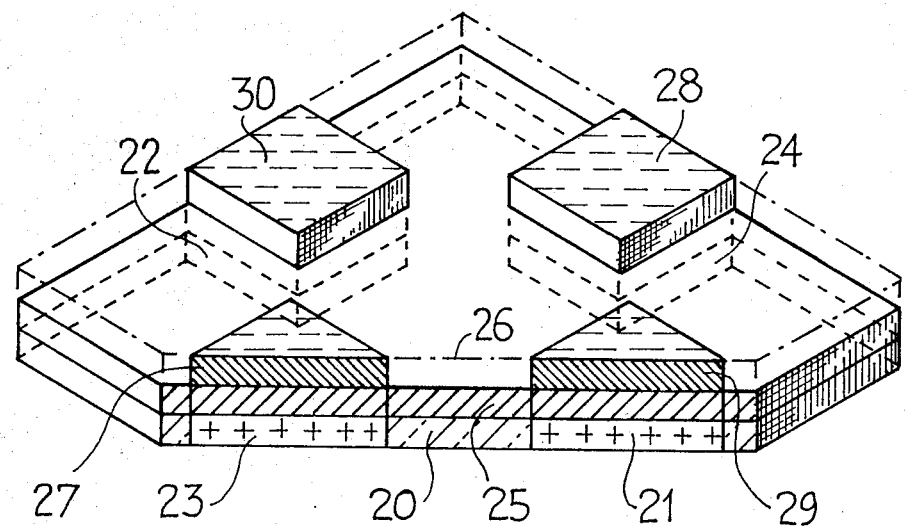
FIGS. 5 to 9 illustrate successive stages in the manufacture of a second embodiment of a connection in accordance with the invention, applied to a system of crossed interconnections.

One of the circuits has been schematically illustrated in FIG. 5, this being a section, seen in perspective, of a substrate 20 containing the zones to be connected.

For example, the substrate 20 will be an intrinsic semiconductor having insulating properties, and the zones 23–24, 21–22, are zones made of the same semiconductors, but heavily doped and forming studs.

The zone 21 is to be electrically connected to the zone 22 and the zone 23 to the zone 24. On this substrate, a layer of metal $M_1$ such as that utilised in the previously described embodiment, is uniformly deposited to produce a layer 25 of thickness $e_1$.

Thereafter, a layer 26, illustrated in chain dotted fashion, of a metal $M_2$ such as that $M_2$ described in the first application, is deposited upon the surface of the wafer. This latter layer 26 is eliminated from all points other than those at which it is intended to be a part of a conductor pattern; consequently, it is left behind only at the zones 23 and 24 in the form of studs 29 and 30.

The wafer thus prepared is subjected to a heat treatment which transforms the metal $M_1$ into an oxide, with an increase in volume, the metal $M_2$ and those parts of the metal $M_1$ protected by the mask constituted by the metal $M_2$, remaining unoxidised.

Figure 6:
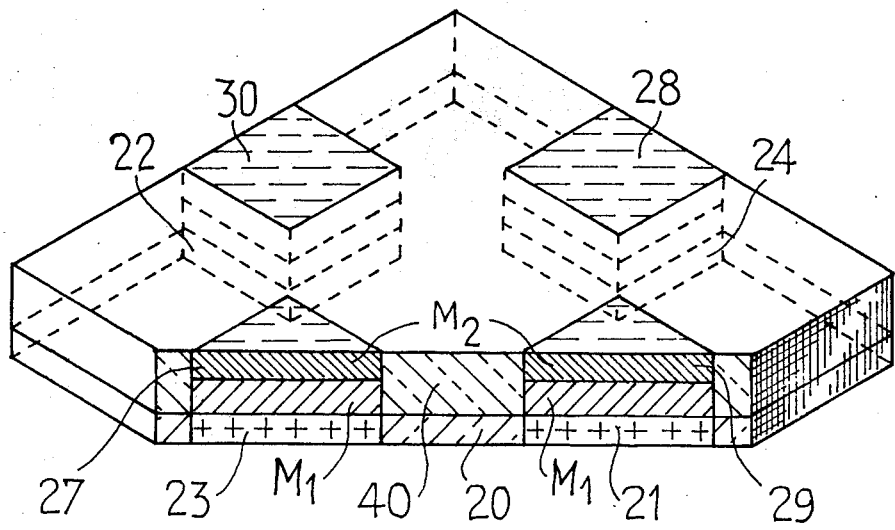

FIG. 6 illustrates the wafer after this oxidising treatment. The oxide 40 of the metal $M_1$ fills all the spaces comprised between the different conductive layers, which latter are thus insulated electrically from one another within a dielectric material. In accordance with the invention, the thicknesses of the metals $M_1$ and $M_2$ being respectively $e_1$ and $e_2$ so that $e_2 = \Delta e_1$ (hereinbefore defined), the surface of the wafer is perfectly flat without any protuberance or recess.

Figure 7:
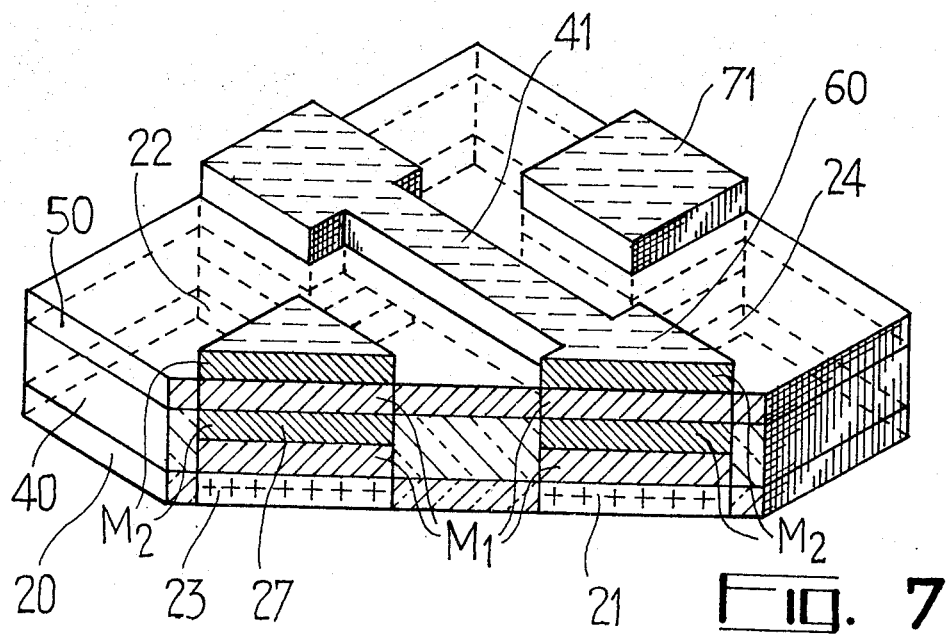

The device is then ready to receive the first interconnection pattern, for example that which links the stub 21 with the stub 22. As FIG. 7 shows, a new layer 50 of metal $M_1$ is deposited over the whole of the surface of the wafer and the layer 60 of metal $M_2$ limited to the zones 21, 22, 23 and 24 which are to be connected, the difference, this time, being that a layer 41 of said same metal $M_2$ is deposited in accordance with the profile of the desired connection, to link the zone 21 with the zone 22.

Figure 8:
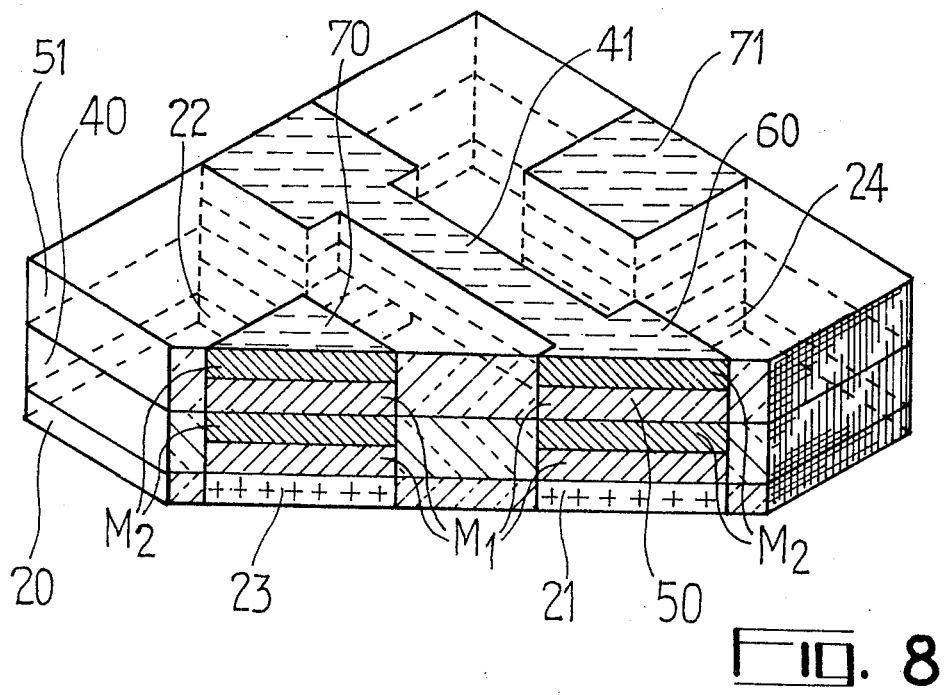

After heat treatment and oxidation of the metal $M_1$, the conductive layers and in particular the interconnection 41, are insulated in the oxide layer 51 of the metal $M_1$, as FIG. 8 shows.

This time, once again the surface of the wafer is perfectly flat since the thickness $e_2$ of the last layer 60 of the metal $M_2$ is equal to the increase in thickness of the last layer 50 of metal $M_1$ consequent upon the oxidation of the said metal $M_1$.

The wafer, in this condition, is ready to receive a new cycle of covering with the metals $M_1$ and $M_2$, followed by oxidation of the metal $M_1$ until a connection is produced linking the zones 23 and 24 via the conductive studs 70 and 71.

Since the technique is identical to that which has been described in the case of the production of the connection 41, the description of this phase of manufacture has been kept brief.

Figure 9:
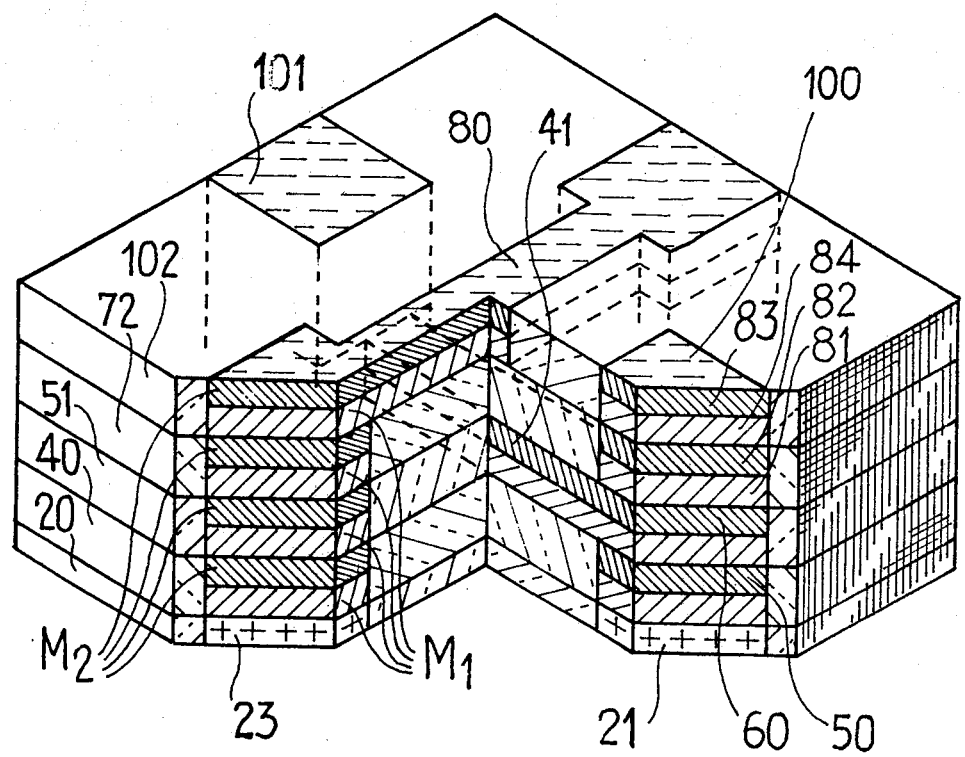

FIG. 9, in which elements already referred to carry the same references, illustrates the device complete with its crossed interconnections.

After the production of the interconnection 41 embedded in the dielectric layer 51, a new layer 81 of the metal $M_1$ and a new layer 82 of the metal $M_2$, are deposited. After oxidation, conductive layers at the zones 21, 22, 23 and 24 are obtained which are embedded in a dielectric layer 72.

The wafer is then ready to receive the interconnection pattern 80 which links the zone 23 with the zone 24 in accordance with a predetermined connecting profile. To do this, two new deposits are produced, namely the deposit 83 of metal $M_1$ and the deposit 84 of metal $M_2$. Metal $M_1$ is oxidised and two conductive studs 100 and 101 corresponding respectively to the zones 21 and 22 are obtained, and a conductive layer 80 linking the zones 23 and 24 and embedded in a dielectric layer 102.

This succession of operations, described earlier, can be repeated as often as required and adapted to produce all kinds of combinations, ending up each time with a flat structure in which conductive layers are embedded in insulating layers. Each metal pair, $M_1$ and $M_2$, furnishes at the location of the metal $M_1$ alone, the insulating layer, and at the location of the superimposition of metal $M_1$ with $M_2$, the conductive layer, whilst the structure remains perfectly flat since the thickness of the metal $M_2$ is chosen equal to the increase in the thickness of the metal $M_1$ as a consequence of the latter's oxidation. In particular, each of the interconnections is insulated from its neighbour by means of a perfectly flat insulating layer of constant thickness which can be regulated as a function of the initial thickness of the oxidisable metal $M_1$.

What we claim is:

1. A multilayer interconnection pattern, for interconnecting at least a first element to a second element, said first and second element being integrated over the same substrate, said interconnection comprising at least a flat combination including at least a first layer of tantalum which is oxidizable by a thermal treatment deposited upon said first and second elements, and a second conductive layer of aluminum which is non-oxidizable by said thermal treatment and deposited between said first and second elements and having a first thickness and at least a third layer of a dielectric oxide provided from oxidation of said first layer of tantalum by said thermal treatment and having said first thickness; said third and second layers forming a flat structure suitable for making said interconnection.

2. A multilayer interconnection as claimed in claim 1 further comprising a succession of flat structures in which conductive layers are alternatingly embedded in insulating layers of dielectric oxide, said conductive layers being linked one with another to form a conductive pattern having a second thickness, said insulating layers having said second thickness, forming with said conductive pattern a flat structure.

* * * * *